United States Patent
Sepulveda Leon (10) Patent No.: US 12,392,812 B2
(45) Date of Patent: Aug. 19, 2025

(54) FAULT PREDICTIVE MONITORING SYSTEM ON A MEDIUM AND/OR HIGH VOLTAGE LINE

(71) Applicant: Gagarin Anibal Sepulveda Leon, Santiago (CL)

(72) Inventor: Gagarin Anibal Sepulveda Leon, Santiago (CL)

( * ) Notice: Subject to any disclaimer, the term of this patent is extended or adjusted under 35 U.S.C. 154(b) by 195 days.

(21) Appl. No.: 18/259,905

(22) PCT Filed: Dec. 30, 2021

(86) PCT No.: PCT/IB2021/062461
§ 371 (c)(1),
(2) Date: Jun. 29, 2023

(87) PCT Pub. No.: WO2022/144822
PCT Pub. Date: Jul. 7, 2022

(65) Prior Publication Data
US 2024/0085468 A1    Mar. 14, 2024

Related U.S. Application Data (60) Provisional application No. 63/132,041, filed on Dec. 30, 2020.

(51) Int. Cl.
*G01R 31/08* (2020.01)
*H02J 50/00* (2016.01)
*H02J 50/10* (2016.01)

(52) U.S. Cl.
CPC ......... *G01R 31/085* (2013.01); *G01R 31/088* (2013.01); *H02J 50/001* (2020.01); *H02J 50/10* (2016.02)

(58) Field of Classification Search
None
See application file for complete search history.

(56) References Cited

U.S. PATENT DOCUMENTS

2009/0079417 A1    3/2009    Mort et al.
2016/0322914 A1    11/2016    Rodriguez Rios
(Continued)

FOREIGN PATENT DOCUMENTS

WO    2020026057 A1    2/2020

OTHER PUBLICATIONS

International Search Report and Written Opinion for Corresponding International Application No. PCT/IB2021/062461, with English translation, Apr. 8, 2022 (23 pages).

*Primary Examiner* — Farhana A Hoque
(74) *Attorney, Agent, or Firm* — Pilloff Passino & Cosenza LLP; Rachel K. Pilloff; Sean A. Passino (57) ABSTRACT

A system for monitoring faults in a medium- and/or high-voltage power line having at least one sensor of a parameter that correlates with the fault, operatively connected to the medium- and/or high-voltage power line or to a medium- and/or high-voltage plug; an analogue-to-digital conversion module, configured to receive a reading from the at least one sensor and deliver a digital representation of the reading to a memory processing and management module that is configured to determine the existence of a fault from the digital representation and, in response to the determination of the existence of the fault, generate representative data of the fault, which are delivered to a communication module configured to encode the representative data and transmit the encoded representative data to a communication interface that is configured to receive the encoded data and transmit them to a remote terminal.

14 Claims, 5 Drawing Sheets

(56) References Cited

U.S. PATENT DOCUMENTS

2018/0351307 A1\* 12/2018 AbuGhazaleh ........ G01R 31/50
2020/0191841 A1 6/2020 Lakirovich et al.

\* cited by examiner

FAULT PREDICTIVE MONITORING SYSTEM ON A MEDIUM AND/OR HIGH VOLTAGE LINE

CROSS REFERENCE TO RELATED APPLICATION

This Application is a 371 of PCT/IB2021/062461 filed on Dec. 30, 2021, which claimed priority of U.S. Provisional Application No. 63/132,041, filed Dec. 30, 2020, each of which are incorporated herein by reference.

FIELD OF THE INVENTION

The present invention relates to monitoring technologies, more specifically to monitoring technologies of electrical systems and in particular provides a fault predictive monitoring system on a medium and/or high voltage line.

BACKGROUND OF THE INVENTION

In industrial processes where machinery powered by electrical energy is used, such as excavation blades and drills used in mining, this equipment is connected to polyphase electrical cable runs, usually three-phase, which are powered by electrical substations. To build these cable runs, these are formed by joining sections of cables that measure from tens to hundreds of meters. These sections at each end have an electrical plug, which can be of the male or female type that are connected to each other and can measure the final cable run several kilometers long.

As a result of the requirements of the operation, the equipment must move according to its specific work plan, requiring that the cable run must also do so. To carry out the displacement is the same equipment in some cases, or other equipment intended for it, those that carry out the movement by printing pulling force to the cable near it, which is transmitted mechanically to the rest, thus producing the transfer of the run.

The normal thing for the operation of the cables is that the male and female electrical connectors of each electrical plug are coupled with those of other cables in a solid form and without gaps, but as a result of the pulling forces to which they are subjected, mechanical stress is produced on the protective structures, which cause them to begin to present small gaps between the union of the electrical conductors of the coupled male-female pair.

When this gap effect occurs and depending on the gap distance and the current circulating in the conductors, electric arcs begin to be created, which initiate a process of ionization and transformation of the metal structures of the connectors through which the arcs flow. This electric arc is the beginning of a catastrophic fault process, since at its climax the connectors melt, the internal structures of the plugs are damaged by the increase in temperature or by the explosions that sometimes occur product that the electrical phases lose their dielectric protections generating short circuits and what is more harmful, is that the operation is stopped in an unplanned way, since the supply of electrical energy is interrupted. The indicated fault process, from its start to its end, can take several hours and even days.

In addition to the fault process described in the electrical plugs and due to faults in the seals of the protective structure, humidity and/or water is introduced inside the electrical plugs which generates that the internal connections are oxidized preventing the normal flow of energy or in more extreme cases, producing short circuits.

There is another type of fault related to the cable run and it is when for different causes, an object of considerable mass presses a cable, which at each end has an electrical plug installed and according to the force exerted at that point, deformations occur in the structure of the cable wrap, in its dielectric insulators, in the electrical mesh that covers the cable and eventually in the metal conductors that are contained therein. In this case, the circulating electrical current remains unchanged, provided that the energy source has the capacity for delivery and product of the deformity, a structural modification will occur in the contact point that will cause an electrical resistance to be generated, which according to its value will cause the temperature to rise at that point, eventually producing a heat collapse. In this case and according to Ohm's law, a voltage variation occurs between the voltages in the phases of the two plugs of both ends of the cable that has received the deforming force.

Accordingly, a fault predictive monitoring system on a medium and/or high voltage line is required.

SUMMARY OF THE INVENTION

The present invention provides a fault predictive monitoring system on a medium and/or high voltage line characterized in that it comprises: at least one sensor of a parameter that correlates with a fault in a medium and/or high voltage cable of said line, operatively connected to said medium and/or high voltage line or to a medium and/or high voltage plug; an analog-to-digital conversion module, configured to receive as input a reading of said parameter from said at least one sensor and output a digital representation of said reading; a memory processing and management module configured to receive as input the digital representation from the analog conversion module, determine the existence of a fault from said digital representation and, in response to determining the existence of said fault, generate representative data of said fault; a communication module configured to receive the representative data of the fault from the memory processing and management module, encoding said representative data and sending said encoded representative data to a communication interface; and a communication interface configured to receive the encoded data from the communication module and transmit said encoded data to a remote terminal; a battery; one or more energy harvesting coils operatively connected to the medium and/or high voltage cable; and a energy module connected to the one or more energy harvesting coils and the battery, and configured to control charging of said battery by energy harvested by said one or more energy harvesting coils and to energize the at least one sensor, the analog-to-digital conversion module, the memory processing and management module, and the communication module; wherein said at least one sensor, said analog-to-digital conversion module, said memory processing and management module, said communication module, and said communication interface are positioned within a medium and/or high voltage plug housing; and wherein said communication interface is wired and configured to transmit said encoded data via a pilot cable of said line, wherein said transmission is performed by overlaying a signal corresponding to said encoded data on a voltage signal of said pilot cable.

In a preferred embodiment, the system is characterized in that it further comprises: at least one light indicative of a state of said medium and/or high voltage cable; and a fault state information module operatively connected to the at least one light and to the memory processing and management module and configured to receive the data indicative of a fault from the memory processing and management module and to control said at least one light in response to said fault. In a more preferred embodiment, the system is characterized in that said at least one light is positioned in a ring-shaped support and in that said ring-shaped support is then positioned, proximally distally, of a distal end of said housing. In an even more preferred embodiment, the system is characterized in that it further comprises a wireless communication transmitting and receiving antenna; a connection interface for a computer; a battery charging interface; and a data output interface; wherein said antenna, said connection interface, said charging interface and said data output interface are positioned on the ring-shaped support. In an even more preferred embodiment, the system is characterized in that said ring-shaped support includes a rotating portion, wherein said antenna, said connection interface, said charging interface and said data output interface are positioned on said rotating portion; and wherein said rotating portion further comprises a weight that is positioned at a position of said rotating portion that is opposite to said antenna, said connection interface, said charging interface and said data output interface. In yet another preferred embodiment, the system is characterized in further comprising a connection interface for a multimeter positioned on the ring-shaped support. In a still further preferred embodiment, the system is characterized in that it further comprises a seal which is then positioned, proximally distally, of a distal end of said ring-shaped support. In yet another preferred embodiment, the system is characterized in that it comprises a plurality of wireless communication transmitting/receiving antennas and a plurality of satellite positioning receivers distributed equidistantly along the ring-shaped support.

In another preferred embodiment, the system is characterized in that said at least one sensor is chosen from the group consisting of temperature sensors, sound sensors, electromagnetic sensors, voltage sensors, current sensors, electrical resistance sensors, humidity sensors, dust sensors, ozone sensors and smoke sensors, as well as a combination thereof.

In a further preferred embodiment, the system is characterized in that it further comprises a housing containing said at least one sensor, the analog-to-digital conversion module, the memory processing and management module and the communication module; wherein said housing is fixed to a dielectric cylinder surrounding said medium and/or high voltage cable and positioned inside the housing.

In another preferred embodiment, the system is characterized in that said medium and/or high voltage line is a three-phase line, comprising three phases, a neutral and a pilot cable, wherein each phase has a dielectric cylinder surrounding a corresponding cable of said phase, and in that the system comprises three housings, each one being fixed to two of the dielectric cylinders of the three-phase line; wherein said three housings, together, contain said at least one sensor, the analog-to-digital conversion module, the memory processing and management module and the communication module; wherein said three housings are positioned inside the housing. In a more preferred embodiment, the system is characterized in that the at least one sensor is positioned at a distal position of the housing containing the same. In an even more preferred embodiment, the system is characterized in that each housing has a prism shape which, in cross-section, has two concave curved faces and a convex curved face; wherein each of said concave curved faces has a shape complementary to a corresponding dielectric cylinder of the line.

In a preferred embodiment, the system is characterized in that said communication interface additionally comprises a wireless communication interface.

DETAILED DESCRIPTION OF THE INVENTION

Then, the present invention will now be described in a detailed manner with reference to the Figures accompanying this application.

Figure 7:
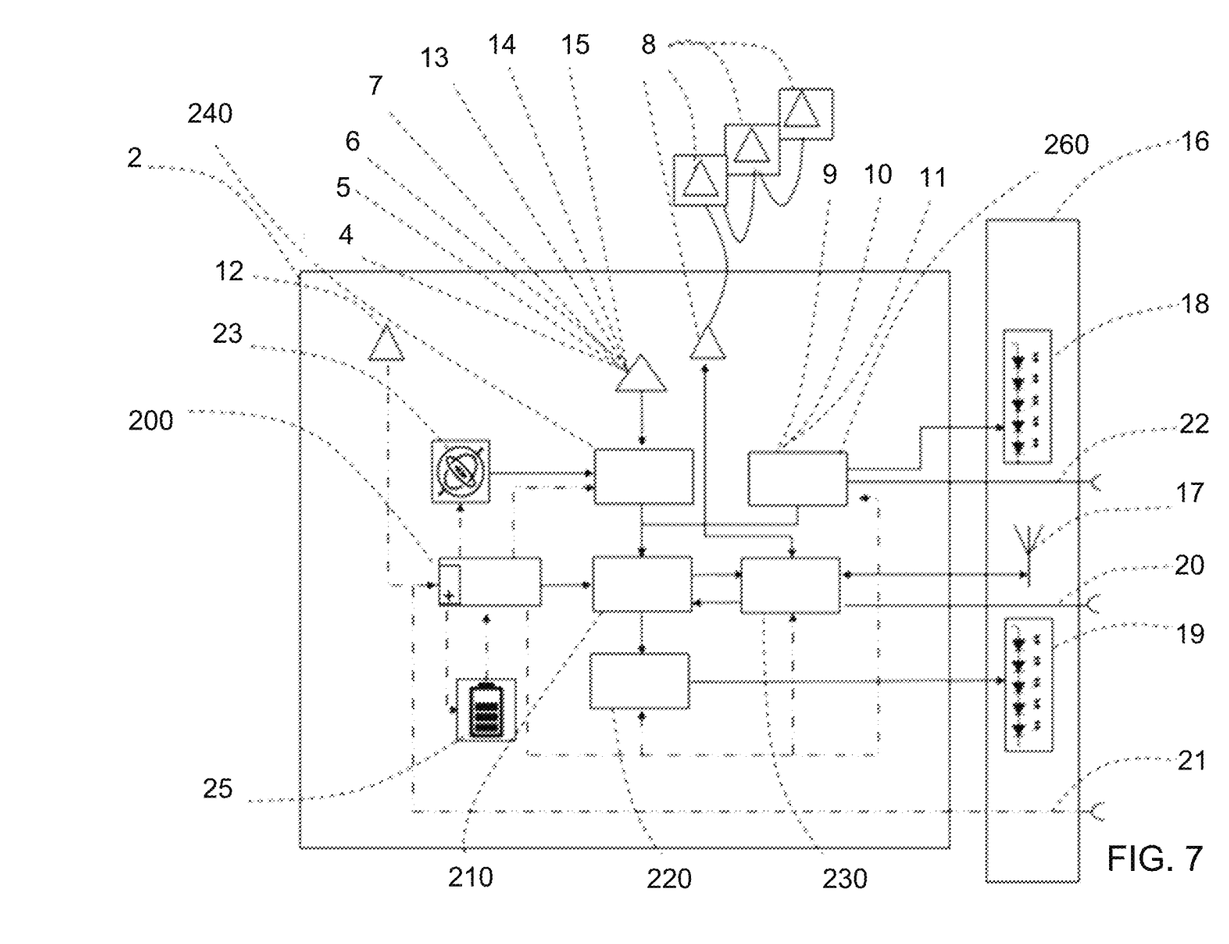
FIG. 7 illustrates a schematic block diagram of a first embodiment of the system that is object of the present invention.

The present invention provides a fault predictive monitoring system on a medium and/or high voltage line comprising, essentially:

at least one sensor (4, 5, 6, 7, 9, 10, 11, 13, 14, 15) of a parameter correlating with a fault in a medium and/or high voltage cable of said line, operatively connected to said medium and/or high voltage cable or to a medium and/or high voltage plug;

an analog-to-digital conversion module (240), configured to receive as input a reading of said parameter from said at least one sensor (9, 10, 11, 13, 14, 15) and deliver as output a digital representation of said reading;

a memory processing and management module (210) configured to receive as input the digital representation from the analog-to-digital conversion module (240), determine the existence of a fault from said digital representation and, in response to determining the existence of said fault, generate representative data of said fault;

a communication module (230) configured to receive the fault representative data from the memory processing and management module (210), encode said representative data and send said encoded representative data to a communication interface (17, 8); and a communication interface (17, 8) configured to receive the encoded data from the communication module (230) and transmit said encoded data to a remote terminal;

a battery (25);

one or more energy harvesting coils (12) operatively connected to the medium and/or high voltage cable; and an energy module (200) connected to the one or more energy harvesting coils (12) and to the battery (25), and configured to control the charging of said battery (25) by means of the energy harvested by said one or more energy harvesting coils (12) and to energize the at least one sensor (4, 5, 6, 7, 9, 10, 11, 13, 14, 15), the analog-to-digital conversion module (240), the memory processing and management module (210) and the communication module (230);

wherein said at least one sensor (4, 5, 6, 7, 9, 10, 11, 13, 14, 15), said analog-to-digital conversion module (240), said memory processing and management module (210), said communication module (230), and said communication interface (17, 8) are positioned inside a housing (130) of the medium and/or high voltage plug; and wherein said communication interface (17, 8) is wired and configured to transmit said encoded data via a pilot cable of said line, wherein said transmission is performed by superimposing a signal corresponding to said encoded data on a voltage signal of said pilot cable.

Figure 4:
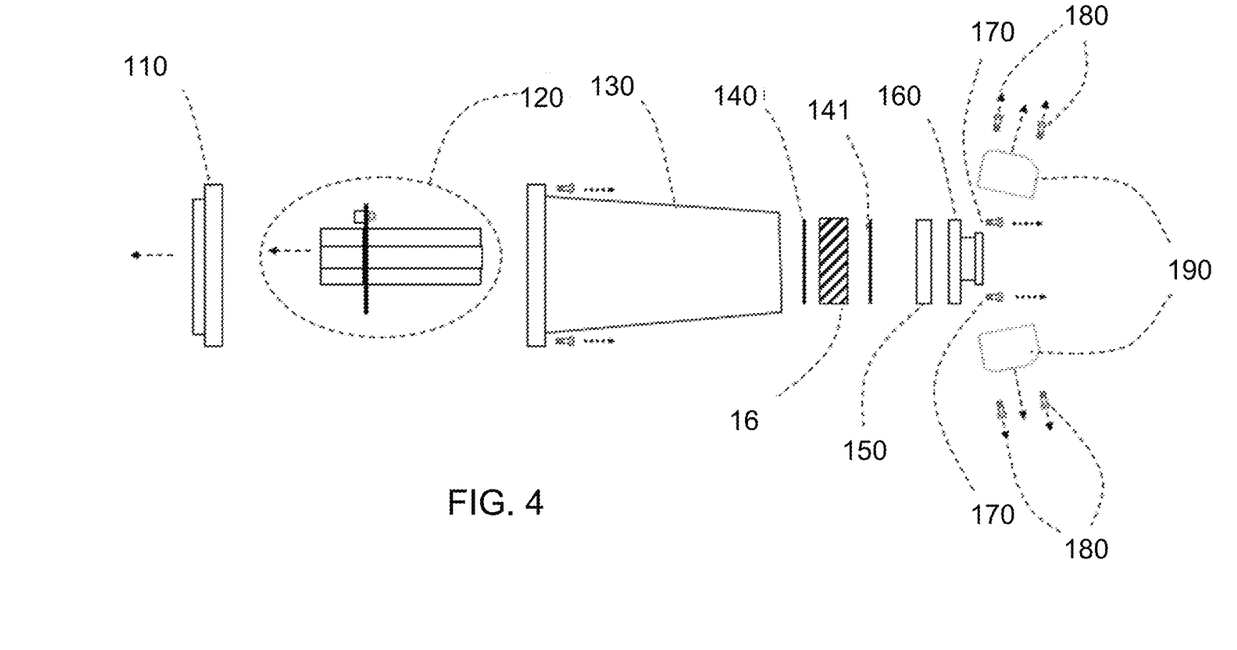
FIG. 4 illustrates an exploded side schematic view of a connector for a medium and/or high voltage line including an embodiment of the system that is object of the present invention.

In the context of the present invention, without limiting the scope thereof, the following references will be used to identify different components of preferred embodiments of the system being object of the present invention:

Electronics or battery support plate: One or more support plates of metallic or plastic material with a metallic coating on the exposed surface, where each of them can be fixed to two of the dielectric cylinders that protect the three-phase voltage lines, according to the possible pairs (124 with 125, 125 with 126 and 124 with 126) and which are part of the internal structure (120) of an electrical plug, where this fixing can be carried out by non-invasive fixing means or anchors, i.e. without the need to drill or modify the internal structure of the electrical plug. For example, said fixing can be carried out by any means that allows the plate or plates to be fixed integrally to the dielectric protective cylinders of the voltage lines, so as to serve as a support for the elements to be fixed therein. The fixation of said support plate(s) may or may not be removable. In the event that they are removable, they can be removed leaving again the internal structure (120) of the electrical plug in its original form. The number of plates can be one, two or three and on one or two of them a corresponding electronic card (2) can be installed on which part of the components that form the system that is the object of the present invention are assembled. Optionally, one or a plurality of rechargeable batteries (25) may be installed on the second and/or third plate.

Electronic card (2): Electronic card where the different electronic circuits that make up the invention are assembled: Energy Module (200), Memory Processing and Management Module (210), Communication Module (230), Analog-to-Digital Data Conversion Module (240), and one or more rechargeable batteries (25), the latter may also be independently on other support boards, depending on the used amount thereof. The electronic card (2) is fixed to the support plate by means of suitable fixing means. In certain preferred embodiments, without limiting the scope of the present invention, this electronic card may further comprise an electrical Plug Fault Status Information Module (220), a Voltage Presence Information Module (260), or an Inertial Measurement Unit, IMU, (23).

Internal temperature sensor (4): One or more temperature sensors that can be coupled to different internal points of the electrical plug and that can be used to know the temperature level that will be raised in the event of a fault in the connectors of the electrical plug. The one or more sensors will send their information to the Memory Processing and Management Module 210, via the Analog-to-Digital Data Conversion Module 240.

External temperature sensor (5): One or more temperature sensors that can be coupled to the external structure or protective housing (130) of the electrical plug and that can be used to know the ambient temperature at which it is exposed, so that by the methods operated by the algorithms housed in the electronics installed on the electronic card (2), the actual temperature of the electrical connectors installed on the electrical plug is known, for example, by a differential value of the temperatures measured by the external temperature sensors (5) and internal temperature sensors (4). In this way an additional method is added for the analysis of a probable fault in the electrical connectors by the mechanism of eliminating the effect of the external or environmental temperature.

Sound sensors (6): One or more sound sensors installed in the internal structure of the electrical plug and which can permanently monitor the sounds generated when electrical sparks occur, when the junction between the electrical connectors of two pair plugs produces voltaic arcs, product of the gap that is created when the plugs are exposed to pulling forces.

Electromagnetic sensor (7): Antenna picking the electromagnetic energy up generated by the voltage arc that occurs when an electrical fault is in process. The antenna is installed in the internal structure (120) of the electrical plug or in the electronic card (2) and the information picked up by the antenna is analyzed by the methods operated by the algorithms housed in the electronics installed in the electronic card (2).

Communication cable for pilot cable (8): Communication cable coming from the electronic card (2) and electrically connected to the terminal (122) of the pilot cable existing in the internal structure (120) of the electrical plug. This communication cable (8) allows the communication module (230) of the electronic card (2) to use the pilot cable as a communication medium, in order to be able to communicate with the other communication modules (230) of the other electrical plugs that are part of the cable run.

Capacitive voltage sensors (9, 10, 11): Capacitive-type voltage sensors installed enveloped on the protective structures (124, 125 and 126) of the connectors or enveloped directly on the electrical insulation of electrical cables installed on the internal structure of the electrical plug. The information picked up by each of these sensors may be sent to a voltage presence Analysis Module (260).

Electromagnetic Flux Harvesting Coil or Pickup Coil (12): Electromagnetic flux receiving coil that occurs when electrical current passes through the electrical cables installed in the internal structure (120) of the electrical plug. This coil is connected to the Energy Module (200) so that the picked up energy feeds the batteries (25).

Humidity and dust sensor (13): Humidity sensor installed in the internal structure (120) of the electrical plug and that is used to know the existence of humidity inside that is product of faults in the seals of its structure (140, 190) or by loss of tightness between the union of the front lid (110) with the housing (130) of the electrical plug, which generates electrical and mechanical faults, product of short circuits or by oxidation of internal components.

Ozone sensor (14): One or a plurality of ozone sensors ($O_3$) installed in the internal zone (120) of the electrical plug, near the point where the electrical connectors of two plugs are interconnected and that seeks to determine the existence of faults in development, by the method of measuring the generation of said gas that is generated when the voltage arc occurs when there is a gap between the connectors.

Smoke sensor (15): one or a plurality of smoke sensors installed in the internal zone (120) of the electrical plug and connected to the electronic card (2), which have the functionality of detecting the smoke that occurs when, in advanced stages of the fault the temperature resulting from an electrical fault, burns the insulating material of the electrical conductors.

Figure 5:
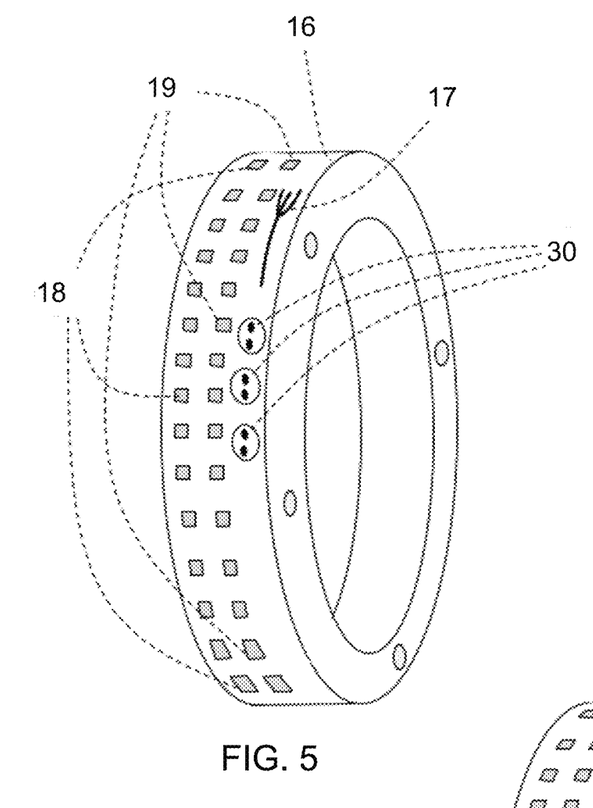
FIG. 5 illustrates a first embodiment of the ring-shaped support being part of a preferred embodiment of the system that is the object of the present invention.
Figure 6:
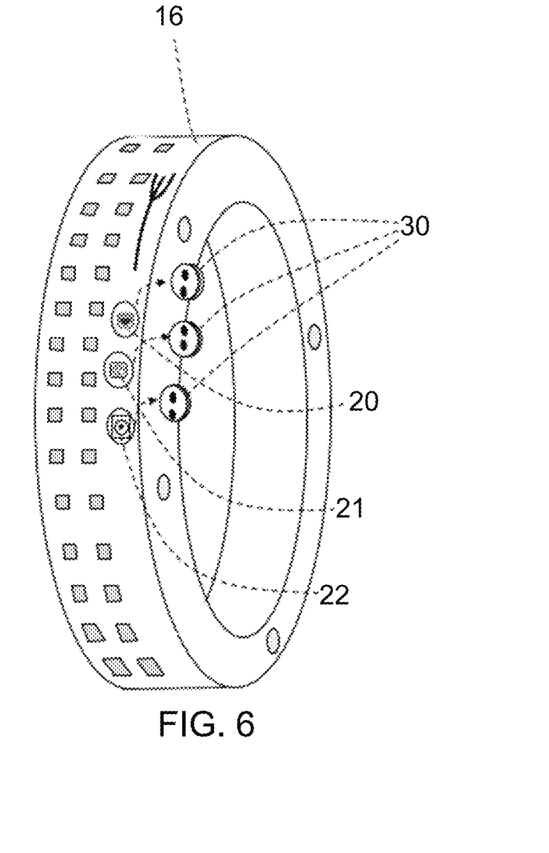
FIG. 6 illustrates a second view of the first embodiment of the ring-shaped support of FIG. 5.

Ring-shaped support or Multimedia Ring (16): Rigid volume in the form of a hollow cylinder or ring that is installed in the protective body of the electrical plug, in the zone posterior to the seal (140) and anterior to the support ring (150). When installing the multimedia ring (16), a new seal (141) is installed next to it on the back to give the degree of protection from humidity and dust. Once the ring-shaped support (16) and the new seal (141) are installed, the clamping screws (170) are replaced by new ones of the same diameter, but of greater length, so that they maintain the objective of fixing all the components.

The ring-shaped support (16) is made of a material that allows the following components to be installed inside it: wireless communication transmitting/receiving antenna (17); one or a plurality of lights (18) used to report the status of the voltage level detected by the capacitive voltage sensors (9, 10 and 11); one or a plurality of lights (19) used to report the existence of a fault process or the level of its severity, through the algorithms operated by the card electronics (2); connector (20) connected to the electronic card (2) that allow when connecting a computer, it can communicate with the electronic card (2) or with any electronic card (2) of another electrical plug, by means of the cable (8) that connects with the pilot cable that in turn connects the electrical plug with the other electrical plugs, using the methods that the Communication Module (230); connector (21) that is used to charge the batteries (25) from the outside, in the event that they are not charged because the pickup coil (12) has not been able to, either because it had not picked up enough energy in the event that the electrical cable installed in the electrical plug (100) was not in operation or because it is defective; connector (22) which is directly connected to a Voltage Presence Module (260) and which when connecting a voltage measurement equipment, for example, a multimeter, at this point will indicate the presence of voltage in the cables of the electrical plug.

Communication antenna (17): A wireless communication transmitting/receiving antenna is one that is designed to establish communication with any public or private antenna.

Voltage status lights (18): one or a plurality of lights (18) used to report the status of the voltage level detected by the capacitive voltage sensors (9, 10 and 11) which will be activated by a voltage presence Analysis Module (260). These lights may be of one or various colors.

Fault status lights (19): one or a plurality of lights (19) used to report the existence of a fault process or the level of its severity in the event that it is under development. These lights are activated from the electrical plug Fault Status Information Module (220). These lights may be of one or various colors.

Communication Connector (20): Connector that is accessible by removing the protective lid (30) and that when connecting a computer to it, using the appropriate algorithms, allows it to communicate with the electronic card (2) and thereby be able to access any information of this electronic card (2) or that, through the communication carried out by the Communication Module (230) when connected through the cable (8) to the terminal (122) of the pilot cable, can be connected to any communication electronics of any electronic card (2) of any electrical plug available in the cable run.

Energy Connector (21): Connector that is accessible when removing the protective lid (30) and that when connecting an external battery or any other compatible energy source, allows the battery (25) or the plurality of them to be charged, this configuration being employed when the battery (25) or the plurality of them has not been charged because the harvesting coil (12) is defective or, that there is no electric current in the electrical connectors installed in the internal structure (120) of the electrical plug.

Voltage information connector (22): Connector that is accessible when removing the protective lid (30) and that when connecting a voltage measurement apparatus, for example, a multimeter, can have an indication in said apparatus regarding the voltage level existing in the electrical cables installed in the internal structure (120) of the electrical plug.

Inertial Measurement Unit (23): Inertial Measurement Unit (IMU) which is used to determine the degree of movements and vibrations that a plug has had so that it serves as an indicative element of mechanical work that influences and correlates with faults in the connections between plugs, when the connectors are separated and begin to generate voltaic arcs. The values delivered by this sensor are employed by the methods implemented by the algorithms residing in the electronics of the electronic card (2).

Rechargeable battery (25): A rechargeable battery or a plurality of them that are powered by the energy delivered by the Energy harvesting coil (12) or by the energy delivered by the connector (21) that allows it to be powered directly from an external energy source. This battery module is responsible for powering all the sensors and all the electronics residing on the electronic card (2), in addition to the antennas (7) and (17), as well as the information lights (18) and (19).

Connector protection (30): Removable humidity and dust protective lids of the Communication Connector (20), the Energy Connector (21), and/or the Voltage Information Connector (22) that provide IP68 protection.

Front lid (110): Detachable electrical plug front lid

Figure 1:
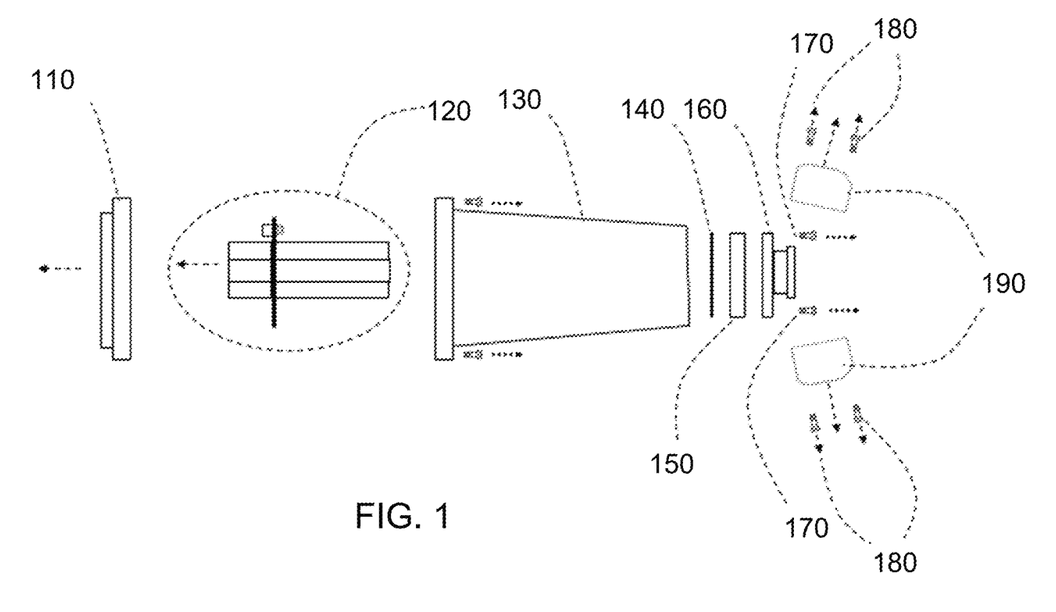
FIG. 1 illustrates an exploded side schematic view of a connector for a prior art medium and/or high voltage line.

Internal structure (120): Internal structure housing the three-phase electric cables that come from the cable and gives the electric protection through dielectric elements.

Internal structure sectional view (121): Cut-away view of the electrical conductor internal protective structure (120).

Pilot cable connection terminal (122): Connection terminal for connecting the pilot cable. The pilot cable is a cable that accompanies the three three-phase electrical cables, which allows sending electrical signals throughout the run so that when there are faults in any element of the cable, safety actuators are activated that stop the flow of energy in the three-phase cables. In this invention, the pilot cable is used as a communication mechanism between the different electronic cards (2) by injecting electrical signals of such intensity and frequency that they do not affect the operation of the pilot cable. When an electronic card (2) receives information sent by another electronic card (2), first filters the electrical signals existing in the Pilot Cable, to determine after that filtering whether there are electrical signals intended for it.

Figure 2:
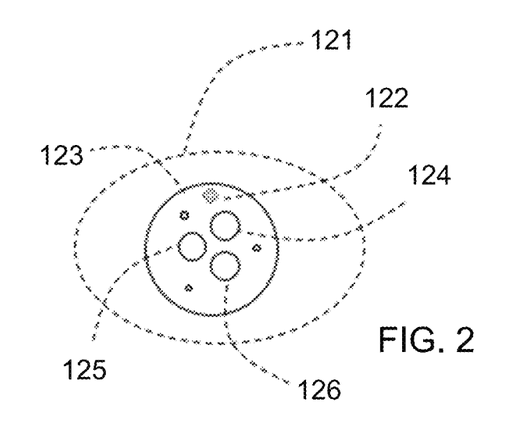
FIG. 2 illustrates a schematic front view of a connector of a prior art medium and/or high voltage line.
Figure 3:
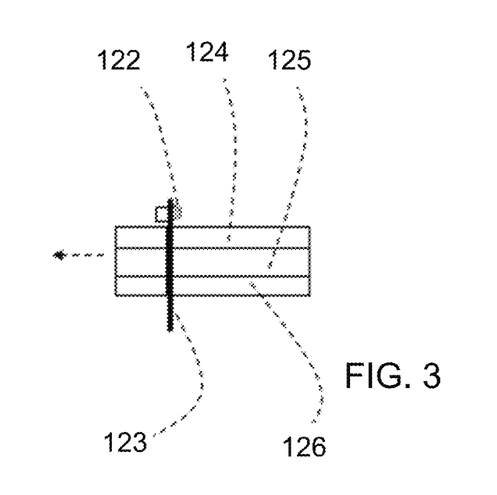
FIG. 3 illustrates a side view of prior art three-phase line protector/connector.

Internal structure circular part (123): Circular structure that supports the protective cylinders of the electrical conductors and that allows them to form a structure that is coupled to the external structure of the electrical plug. This structure has three cylinders built by dielectric material (124, 125 and 126) which electrically isolate the three-phase cables that are at the ends of the cable and from which the dielectric and electromagnetic protection have been removed.

Dielectric protections (124, 125 and 126): Protective cylinder of dielectric material in which, inside, the electrical cable exposes the electrical conductor without the dielectric protection cover.

Electrical plug housing (130): External structure of the electrical plug, which is what protects the interior of the plug.

Seal (141) Protective seal against Humidity and dust which, being in poor condition or having low pressure, allows water access to the inside of the electrical plug.

Seal (141): Protective seal against Humidity and dust that is subsequently installed to the ring-shaped support (16).

Support ring (150): Cylindrical ring supporting the internal structure of the electric plug seal.

Internal structure (160): Internal structure of the electrical plug seal. It serves as a fastening base for the rear seal structure to be anchored.

Rear seal (190): Rear seal of the electrical plug. This seal has inside two pieces of adaptable material that when pressing on the dielectric cover of the electrical cable provides the protection against water that the electrical plug needs. This seal, being damaged or having low pressure, causes the water to enter the electrical plug generating the faults due to humidity.

Energy Module (200): Electronic components assembled on the electronic card (2) that receives the energy picked up by the electromagnetic flux pickup coil (12) or the energy connector (21) to charge one or a plurality of rechargeable batteries (25), and then, with the energy stored in the battery or plurality of batteries (25), electrically supply the rest of the components of the electronic card and the elements that are housed in the multimedia ring (16).

Memory Process and Management Module (210): Electronic components assembled on the electronic card (2) that receive the data collected by the different sensors and that are delivered to it by the Analog-to-Digital Data Conversion Module (240) and by the Voltage Presence Analysis Module (260). With this data the module applies the different methods comprising algorithms executed by the same to analyze whether or not there is a fault process in progress in the electrical plug or in the section of cables between two electrical plugs, delivering this information to the electrical plug Fault Status Information Module (220). Additionally, the memory processing and management module (210) working in coordination with the communication module (230) coordinates and determines by which available means the information will be sent to a Central server.

Electrical Plug Fault Status Information Module (220): These optional electronic components that are assembled on the electronic card (2) activate the operation of one or a plurality of lights (19) housed in the multimedia ring (16), whereupon the different lights will light up with the colors and frequency that corresponds to the fault state of the electrical plug.

Communication Module (230): Electronic components arranged on the electronic card (2) and which are responsible for encoding the data that the Memory Processing and Management Module (210) has determined must be sent to a given electronic card (2). The means provided by this communication module (230) can be the sending of the data to the public or private antenna using the communication antenna (17), the pilot cable through the cable (8) that is connected to the terminal (122) of said cable when it is connected to the internal structure (120) of the electrical plug or through the communication connector (20) available in the multimedia ring (16) of the electrical plug itself or another available in the run of electrical cables.

Analog-to-Digital Data Conversion Module (240): Electronic components assembled on the electronic card (2) that are responsible for receiving all the analog signals picked up and sent by the different sensors of the invention, which are transformed into digital format to be operated according to the methods applied by the algorithms that are executed in the Memory Processing and Management Module (210).

Voltage Presence Analysis Module (260): Optional electronic components installed on the electronic card (2) that are responsible for receiving and amplifying the signals picked up by the capacitive voltage sensors (9, 10 and 11) and then converting them to digital format. This module directly activates one or a plurality of lights (18) that report the presence of voltage in addition to sending them directly to the memory processing and management module (210) so that their data are operated together with the data of the other sensors by the methods contemplated by the algorithms that said module operates.

Additionally, this module delivers a voltage signal to the voltage information connector (22), which is correlated to the actual voltage level that exists in the electrical cables installed in the internal structure (120) of the electrical plug.

As previously mentioned, the system of the present invention comprises a set of electronic elements that are installed in the internal structure of the plug (120), particularly inside the housing (130) of the plug (120). In some preferred embodiments however, the system may comprise electronics positioned in the external structure of the electrical plug. Additionally, in some preferred embodiments and without limiting the scope of the present invention, the system may comprise an auxiliary computer and/or a mainframe computer (not illustrated in the figures) that may be configured to accumulate, process, and distribute the collected information for use by one or more users. Additionally, in some preferred embodiments and without limiting the scope of the present invention, the auxiliary computer and/or the mainframe computer may comprise a user interface, for example, a graphical user interface, GUI, for informing users of a type of fault under development.

In an exemplary embodiment, without limiting the scope of the present invention, when a small gap occurs between an electrical connector and the connector to which it is matched, a fault is generated as a result of voltage arcs being formed in said gap. In this example, without limiting the scope of the present invention, the following physical phenomena occur that the system of the present invention can detect to monitor the fault process: emission of an electromagnetic signal generated by each spark produced by the voltage arc; increase of the temperature in the electrical connector, the cables that compose it and their dielectric insulations by the phenomenon of heat transmission; emission of mechanical energy, since when a spark is generated, part of the energy is transformed into sound; emission of light energy since when a spark is generated, part of the energy generates photons; emission of ozone O3 gas as a result of the corona effect as a result of the ionization of the air in the gap and smoke emission zone, which is generated when the temperature reaches a level such that it begins to burn the dielectric cover of the protective sheaths of the electrical cables.

Thus, in a preferred embodiment, without limiting the scope of the present invention, the at least one sensor (4, 5, 6, 7, 9, 10, 11, 13, 14, 15) may be chosen from the group consisting of temperature sensors (4, 5), sound sensors (6), electromagnetic sensors (7), voltage sensors (9, 10, 11), current sensors, electrical resistance sensors, humidity sensors (13), dust sensors, ozone sensors (14) and smoke sensors (15), as well as a combination thereof.

In another exemplary embodiment, without this limiting the scope of the present invention, when a plug has had a fault in the protective seals (140, 160 or 190), in the junction between the front lid (110) and the housing (130) or some type of crack has been generated in the protective housing (130), this causes its insulation against humidity or water to be extinguished allowing this element to enter inside the electrical plug and therefore, in this exemplary embodiment, the system can monitor the presence of humidity inside the structure of the electrical plug.

In another example of embodiment, without limiting the scope of the present invention, when a cable has been damaged due to the action of a mass that has deformed it, the system that is the object of the present invention can determine the existence of this phenomenon by continuously measuring the voltage differential in each phase of the electrical plug existing at each end of the cable section.

Because the measurement and processing components installed in each electrical plug can generate a large amount of data that must be analyzed, either locally or at a remote central server, the system that is the subject of the present invention can employ a distributed communication strategy to ensure that each plug transfers its data. This strategy considers that each plug comprises the necessary electronic elements, implemented in the communication module (230), that allow the data to be sent to the central server directly through an antenna (17) that communicates with a receiving antenna or, in the event that the antenna (17) cannot communicate with the receiving antenna, for example, due to that of the terrain topology or for another reason, the communication module (230) can be configured to transfer the data to an auxiliary computer connected to any electrical plug of the run that incorporates the system that is the object of the present invention, by means of its corresponding communication module (230), so that from there and using the auxiliary computer, a communication antenna of the auxiliary computer can establish communication with the receiving antenna of the central server. In another exemplary embodiment, without limiting the scope of the present invention, in the event that a TCP/IP communication provider connector exists, the auxiliary computer may establish communication via said TCP/IP connector.

However, advantageously and without limiting the scope of the present invention, the communication module (230) can transfer the data to the central server or to the auxiliary computer by means of a communication connector (20) arranged on a ring-shaped support (16), also interchangeably referred to as multimedia ring (16). In another exemplary embodiment, without limiting the scope of the present invention, the communication module (230) may use the energy line pilot cable as the communication interface (8). For this, the communication module (230) can be connected to a terminal of the pilot cable of the electrical plug in which it is installed, by means of the communication cable (8). Thus, advantageously and without limiting the scope of the present invention, any communication module (230) available in the run of interest may have access to any other communication module (230) available in the run. In the context of the present invention, without limiting the scope thereof, it should be understood as pilot cable to a safety signal cable having the cable run that provide energy to the equipment. In this preferred embodiment, without limiting the scope of the present invention, the communication module (230) may be configured to send or receive the information through the pilot cable in aggregate form to the normal electrical signals of said pilot cable, at a level and frequency such that they do not affect its operation. For example, and without limiting the scope of the present invention, the communication module (230) may deliver or receive information by filtering the signals that it delivers or receives so that it only knows those that it operates thereby avoiding receiving the normal signals that the pilot cable operates.

In normal operation, the at least one sensor (4, 5, 6, 7, 9, 10, 11, 13, 14, 15), e.g. the sensors: internal temperature (4); external temperature sensors (5); sound sensors (6); the signal picked up by the electromagnetic sensor (7); humidity sensors (13); ozone O3 sensors (14); smoke sensors (15), delivers the picked up data to the Analog-to-Digital Data Conversion Module (240) which in turn converts the data to digital format, delivers them to the Memory Processing and Management Module (210) who processes the same.

In a preferred embodiment, without limiting the scope of the present invention, the system can comprise, in parallel and without going through the Analog-to-Digital Data Conversion Module (240), one or more capacitive voltage sensors (9, 10, 11), which can deliver their data to a Voltage Presence Analysis Module (260). The Voltage Presence Analysis Module (260) may have its own analog-to-digital conversion submodule, which analyzes the picked up voltages by delivering the processed information to the Memory Processing and Management Module (210), as well as to one or a plurality of lights (18) used to report the status of the voltage level detected by the capacitive voltage sensors (9, 10 and 11).

The Memory Processing and Management Module (210) can process the data delivered by the Analog-to-Digital Data Conversion Module (240) and, in cases where it is provided, by the Voltage Presence Analysis Module (260) and according to the methods that its algorithms operate that analyze the data captured by the different sensors, it can deliver the operating state of the electrical plug to one or a plurality of lights (19) used to report the existence of a fault process or the level of its severity. In parallel, the Memory Processing and Management Module 210 can organize the collected data with the required level of detail and send it to the Communication Module 230, which as indicated above can deliver the information to a Communication Antenna 240 via the wireless communication transmitting/receiving antenna 17, or via the pilot cable of the plug.

Advantageously, without limiting the scope of the present invention, the electrical energy required for the operation of the different components forming the system that is the object of the present invention can be provided by the Energy Module (200) which in turn is powered by one or a plurality of rechargeable batteries (25). The energy that is used to recharge the rechargeable batteries (25) may be delivered by the electromagnetic flux pickup coil (12), also referred to as the pickup coil (12). In the event that this Harvesting Coil (12) does not pick up enough energy, either because it is defective or because the current flow that passes through the cable connected to the electrical plug is insufficient or zero, the Energy Module (200) can receive energy through a connector (21), either to charge the rechargeable batteries (25) or to operate the circuit residing in the electronic card (2) or in the multimedia ring (16).

In a preferred embodiment, in the event that a user wishes to know the status of the voltage level of the connectors installed in the electrical plug, said user can know this by the following means: Displaying of the voltage level of each phase of the conductors by means of the displaying of the deployed information in a deployed software in one or more user computers; displaying of the state of the voltage level in the activation of one or a plurality of lights (18) installed in a multimedia ring (16); by means of the physical connection of a voltage measurement equipment to a connector (22) installed in the multimedia ring (16); displaying of the information generated by the antenna (17) by means of a mobile equipment either smart phone or personal computer, which picking up the transmission that said antenna sends to the public or private antenna and employing the methods contained in the algorithms it operates, can decrypt the information to show it on its screen.

In a preferred embodiment, without limiting the scope of the present invention, in the event of a fault, such as the generation of a voltage arc or entry of liquid or humidity to an electrical plug or by the deformation of a cable, the information picked up by the sensors is sent to the users of the system by the means described in the previous paragraph. In the event of a catastrophic fault where the electrical energy has ceased to flow in the run of electrical cables, the information of which is the electrical plug or of which section of cable where the fault occurred is also informed to the users of the system but, in the event that product of a catastrophic fault of a magnitude such that the pilot cable existing in the cable run has also been destroyed, a user equipped with a personal computer can connect to the communication connector (20) residing in the multimedia ring (16) and from there can survey and analyze the status of the electronics installed on the electronic card (2) of the electrical plug where it was connected or, through the methods provided by the algorithms executed by the Memory Processing and Management Module (210) and through the Communication Module (230) that is connected to the pilot cable through the cable (8), can know the status of other Electrical Plugs connected to the pilot cable, in the sections in which it is operating correctly.

For installation in the internal structure (120) of the electrical plug, in particular inside the housing (130), one or more plates of metallic or plastic material with metallic coating can be used on their exposed surface which can be fixed integrally to two adjacent protection cylinders (124 with 125, 125 with 126 or 124 with 126), with hooks or other means that fix the same to them but without effecting any modification in their structure, such as, for example, perforations for the passage of screws. On the plate, the electronic card (2) can be fixed, for example, by using bolts or screws, and on it, an envelope protection volume preferably of the same plate material adhered to the adjacent protection cylinders (124 with 125, 125 with 126 or 124 with 126) can be fixed. In this way, one, two or three volumes useful for positioning the elements being part of the system that is the object of the present invention can be provided inside the housing (130) of the electrical plug. The electrical ground of the cable that is available inside the electrical plug may be connected to the ground of the electrical board (2) and further to the metal element of the board and of the volume so that the circuits of the electronic card are electromagnetically protected, for example, by the Faraday Cage effect.

The ring-shaped support (16), also referred to as a multimedia ring (16), in which the antenna (17) is installed; one or a plurality of lights (18); one or a plurality of lights (19); the communication connector (20); the energy connector (21), the information measurement connector (22) picked up by the voltage sensors (9, 10 and 11) and the three protections (30), can be installed between the humidity and dust seals (141 and 142) to subsequently continue with the original structure that continues with the support ring (150). For the fixing of this entire structure, the corresponding fixing screws (170) can be extended to cover the new distance to be fixed.

According to the previously detailed description it is possible to obtain a fault predictive monitoring system in a medium and/or high voltage line that allows to overcome the deficiencies of the prior art.

It should be understood that the different options previously described for different technical characteristics of the system that is object of the present invention may be combined with each other, or with other options known to a person ordinarily skilled in the art, in any manner provided without limiting the scope of the present application.

The invention claimed is:

1. A fault predictive monitoring system on a medium and/or high voltage line, comprising:
   at least one sensor of a parameter that correlates with a fault in a medium and/or high voltage cable of said line, operatively connected to said medium and/or high voltage line or to a medium and/or high voltage plug;
   an analog-to-digital conversion module, configured to receive as input a reading of said parameter from said at least one sensor and deliver as output a digital representation of said reading;
   a memory processing and management module configured to receive as input the digital representation from the analog conversion module, determine the existence of the fault from said digital representation and, in response to determining the existence of said fault, generate representative data of said fault;
   a communication module configured to receive the fault representative data from the memory processing and management module, encode said representative data and send said encoded representative data to a communication interface; and
   the communication interface configured to receive the encoded data from the communication module and transmit said encoded data to a remote terminal;
   a battery;
   one or more energy harvesting coils operatively connected to the medium and/or high voltage cable; and
   an energy module connected to the one or more energy harvesting coils and to the battery, and configured to control the charging of said battery by means of the energy harvested by said one or more energy harvesting coils and to energize the at least one sensor, the analog-to-digital conversion module, the memory processing and management module and the communication module;
   wherein said at least one sensor, said analog-to-digital conversion module, said memory processing and management module, said communication module, and said communication interface are positioned inside a housing of the medium and/or high voltage plug; and
   wherein said communication interface is wired and configured to transmit said encoded data via a pilot cable of said line, wherein said transmission is performed by superimposing a signal corresponding to said encoded data on a voltage signal of said pilot cable.

2. The system of claim 1, further comprising:
   at least one light indicative of a state of said medium and/or high voltage cable; and
   a fault state information module operatively connected to the at least one light and to the memory processing and management module and configured to receive the data indicative of a fault from the memory processing and management module and to control said at least one light in response to said fault.

3. The system of claim 2, wherein said at least one light is positioned in a ring-shaped support and in that said ring-shaped support is then positioned, proximally distally, of a distal end of said housing.

4. The system of claim 3, further comprising a wireless communication transmitting and receiving antenna; a connection interface for a computer; a battery charging interface; and a data output interface;
wherein said antenna, said connection interface, said charging interface, and said data output interface are positioned on the ring-shaped support.

5. The system of claim 4, wherein said ring-shaped support includes a rotating portion, wherein said antenna, said connection interface, said charging interface and said data output interface are positioned on said rotating portion; and wherein said rotating portion further comprises a weight that is positioned at a position of said rotating portion that is opposite to said antenna, said connection interface, said charging interface and said data output interface.

6. The system of claim 3, further comprising a connection interface for a multimeter positioned on the ring-shaped support.

7. The system of claim 3, further comprising a seal which is then positioned, proximally distally, of a distal end of said ring-shaped support.

8. The system of claim 3, comprising a plurality of wireless communication transmitting and receiving antennas and a plurality of satellite positioning receivers distributed equidistantly along the ring-shaped support.

9. The system of claim 1, wherein said at least one sensor is selected from the group consisting of temperature sensors, sound sensors, electromagnetic sensors, voltage sensors, current sensors, electrical resistance sensors, humidity sensors, dust sensors, ozone sensors, smoke sensors, and combination thereof.

10. The system of claim 1, further comprising a housing containing said at least one sensor, the analog-to-digital conversion module, the memory processing and management module and the communication module; wherein said housing is fixed to a dielectric cylinder surrounding said medium and/or high voltage cable and positioned inside the housing.

11. The system of claim 1, wherein said medium and/or high voltage line is a three-phase line, comprising three phases, a neutral and a pilot cable, wherein each phase has a dielectric cylinder surrounding a corresponding cable of said phase, and in that the system comprises three housings, each one being fixed to two of the dielectric cylinders of the three-phase line; wherein said three housings, together, contain said at least one sensor, the analog-to-digital conversion module, the memory processing and management module and the communication module; wherein said three housings are positioned inside the housing.

12. The system of claim 10, wherein the at least one sensor is positioned at a distal position of the housing containing the same.

13. The system of claim 12, wherein each housing has a prism shape which, in cross-section, has two concave curved faces and a convex curved face; wherein each of said concave curved faces has a shape complementary to a corresponding dielectric cylinder of the line.

14. The system of claim 1, wherein said communication interface further comprises a wireless communication interface.

* * * * *